United States Patent
Keylian et al.

(10) Patent No.: US 10,990,218 B2
(45) Date of Patent: Apr. 27, 2021

(54) DYNAMIC DISPLAY PANEL SYSTEM CONTAINING PUSH BUTTON ASSEMBLIES

(71) Applicant: SUZOHAPP AMERICAS LLC, Mount Prospect, IL (US)

(72) Inventors: Pierre Hagop Keylian, Henderson, NV (US); Anthony Michael Jeffs, Las Vegas, NV (US); Donald James Twyman, Henderson, NV (US)

(73) Assignee: SUZOHAPP AMERICAS LLC, Mount Prospect, IL (US)

( * ) Notice: Subject to any disclaimer, the term of this patent is extended or adjusted under 35 U.S.C. 154(b) by 0 days.

(21) Appl. No.: 16/893,812

(22) Filed: Jun. 5, 2020

(65) Prior Publication Data
US 2020/0401261 A1 Dec. 24, 2020

Related U.S. Application Data

(63) Continuation of application No. 16/264,168, filed on Jan. 31, 2019, now Pat. No. 10,678,371.
(Continued)

(51) Int. Cl.
| | |
|---|---|
| *G06F 3/041* | (2006.01) |
| *A63F 13/211* | (2014.01) |
| *A63F 13/26* | (2014.01) |
| *A63F 13/428* | (2014.01) |
| *A63F 13/5255* | (2014.01) |
| *G02B 5/30* | (2006.01) |

(Continued)

(52) U.S. Cl.
CPC .......... *G06F 3/0416* (2013.01); *A63F 13/211* (2014.09); *A63F 13/26* (2014.09); *A63F 13/428* (2014.09); *A63F 13/5255* (2014.09); *G02B 5/3025* (2013.01); *G02B 27/0955* (2013.01); *G06F 3/016* (2013.01); *G06F 3/0412* (2013.01); *G06F 3/0488* (2013.01); *A63F 2300/30* (2013.01); *G08C 17/02* (2013.01); *G08C 2201/71* (2013.01); *G08C 2201/91* (2013.01)

(58) Field of Classification Search
USPC ....................................................... 200/50.36
See application file for complete search history.

(56) References Cited

U.S. PATENT DOCUMENTS

| | | | | |
|---|---|---|---|---|
| 6,517,068 | B1 * | 2/2003 | Leifer ................... | G02F 1/1336 273/148 R |
| 6,517,069 | B1 * | 2/2003 | Leifer .................... | H04M 1/22 273/148 R |

(Continued)

*Primary Examiner* — Deeprose Subedi
(74) *Attorney, Agent, or Firm* — Hogan Lovells US LLP

(57) ABSTRACT

A dynamic panel system for user interaction through visual displays, touchscreens, and selectable buttons is provided. The dynamic panel system may be part of an interactive system that include push buttons having an image conduit to transmit images from an image generation or display element to a visible area of the button. The push button assemblies may contain liquid ingresses configured to direct liquids away from vulnerable components and into a liquid retention cavity, or may be configured such that liquid is returned to a top panel surface of the dynamic panel system. The push button assemblies may further be configured such that liquid is prevented from entering into the assembly at all. The components may be provided in a modular configuration, allowing for easy assembly, replacement, repair, and cleaning.

12 Claims, 11 Drawing Sheets

Related U.S. Application Data

(60) Provisional application No. 62/673,697, filed on May 18, 2018, provisional application No. 62/758,142, filed on Nov. 9, 2018.

(51) Int. Cl.
  *G02B 27/09*  (2006.01)
  *G06F 3/01*   (2006.01)
  *G06F 3/0488* (2013.01)
  *G08C 17/02*  (2006.01)

(56) References Cited

U.S. PATENT DOCUMENTS

| | | | |
|---|---|---|---|
| 2012/0040759 A1* | 2/2012 | Ito | A63F 13/843 |
| | | | 463/37 |
| 2013/0109473 A1* | 5/2013 | Yamashita | A63F 13/5258 |
| | | | 463/31 |
| 2013/0265217 A1* | 10/2013 | Sakaguchi | G06F 3/0338 |
| | | | 345/156 |

* cited by examiner

DYNAMIC DISPLAY PANEL SYSTEM CONTAINING PUSH BUTTON ASSEMBLIES

CROSS REFERENCE TO RELATED APPLICATIONS

The present application is a continuation of U.S. patent application Ser. No. 16/264,168, filed on Jan. 31, 2019, which claims priority to: U.S. Provisional Patent Application No. 62/673,697, entitled "Dynamic Display Panel System Containing Push Button Assemblies," filed May 18, 2018, and (ii) U.S. Provisional Patent Application No. 62/758,142, entitled "Dynamic Display Panel System Containing Push Button Assemblies," filed Nov. 9, 2018. The disclosures of the above-referenced applications are hereby incorporated by reference.

FIELD OF THE INVENTION

This invention pertains to dynamic panel systems that provide user interaction through visual display, touchscreens, and selectable buttons. In particular, the invention is directed to interactive systems that include push buttons having an image conduit to transmit images from an image generation or display element to a visible area of the button. The push button assemblies may contain liquid ingresses configured to direct liquids away from vulnerable components and into a liquid retention cavity, or may be configured such that liquid is returned to a top panel surface of the dynamic panel system. The push button assemblies may further be configured such that liquid is prevented from entering into the assembly at all.

BACKGROUND OF THE INVENTION

In the gaming industry and broadcasting industries, many different types of interactive display systems allow users to make selections, often through push buttons. These push buttons are typically connected to sensors or switches, and provide an indication to processing circuitry within a device indicating that the user has made a particular selection, with the processing circuitry then converting this indicated user selection into a new visual display. In many of these systems, the push buttons are integrated into an overall gaming device or broadcasting display.

Currently, consumers struggle with assembling and servicing these interactive display systems, as the interactive components including the push buttons are often unique to the system and sometimes integrally assembled with other components. Thus, it can be time consuming and difficult to assemble the systems, and in-field servicing of any display system is complicated. These prior art systems also cannot be easily replaced, repaired, or cleaned without dismantling complete assembly, leading to increases in costs and time. Service personnel may, due to disassembly or re-assembly, cause damage or non-operation due to complexity of product.

Further, when in use, these interactive display systems are often subject to liquid spills that can harm vulnerable components, such as internal circuitry, printed circuit boards, or LCD components. For example, in the gaming industry, it is common for users to spill drinks onto a gaming device or interactive display. Once spilled, the liquid often enters into cracks or spaces surrounding push buttons, contacting vulnerable areas and components and damaging the system. For example, existing prior art systems allow liquid to be trapped in the button assembly and cause sticking or non-operation due to material build up or electrical malfunction. Other prior art systems allow liquid to enter onto face of display elements, such as LCD displays, which can detrimentally affect the image. Still other prior art systems allow liquid to pass through the button into the machine cavity, without any control, thereby possibly causing other electrical issues.

What is needed is a modular, easy to assemble and service, dynamic panel system having push button assemblies that protect against liquid spills.

SUMMARY OF THE INVENTION

The present invention is directed to a dynamic panel system including push buttons for user interaction. The system includes a modular components contained within a housing, allowing for easy assembly, replacement, repair, and servicing. The housing may have a top surface, such as a glass with touch sensitive capabilities, that may be opened or remove to allow access to the interior. Openings in the top surface allow for user input devices, such as push button assemblies, to protrude through the top surface for user interaction. The push button assemblies may contain liquid ingresses configured to direct liquids away from vulnerable components and into a liquid retention cavity, or may be configured such that liquid is returned to a top panel surface of the dynamic panel system. The push button assemblies may further be configured such that liquid is prevented from entering into the assembly at all. In addition, the push button assemblies may include devices to provide haptic, or tactile, feedback during the user interaction.

The dynamic panel system includes components to sense activation of the push button assemblies by a user. The push button may include switches which are activated when the button is pushed, or depressed, by a user. These switches may be in communication with a printed circuit board assembly (PCBA), providing a signal when the button is depressed by the user. The PCBA may receive this signal that the button has been depressed, and then activate a haptic feedback device within, or connected to, the push button assembly. The haptic feedback device provides an audible sound, such as clicking sound, and tactile feedback to the user. This may haptic feedback signals to the user that the button has been pressed. While the term push button is used herein, it should be understood that other user input devices, such as selection keys, switches, or dials could also be used. The push button assemblies may include a transparent top surface, such as a lens element, allowing visual from an underlying display element, such as an LED or LCD display, to be transferred through an image conduit such that they are visible to the user through the top of the push button assembly. Strategic placement of the sensing elements within the push button assembly is provided to ensure that the content of the display element is not blocked or distorted as it is transferred to the top surface of the push button assembly.

DETAILED DESCRIPTION

The present invention is directed to systems and methods for dynamic panel systems having push button assemblies located therein. The push button assemblies may be configured with a lens element on the top, allowing visual images from an underlying display element, such as an LED or LCD display, to be transferred through an image conduit such that they are visible to the user through the top of the push button assembly. Strategic placement of the sensing elements within the push button assembly is provided to ensure that the content of the display element is not blocked or distorted as it is transferred to the top surface of the push button assembly. Further, liquid ingress protection is provided in the push button assemblies, through strategically placed channels, trays, and conduits to direct the flow any liquid away from vulnerable elements in the system.

Figure 1A:
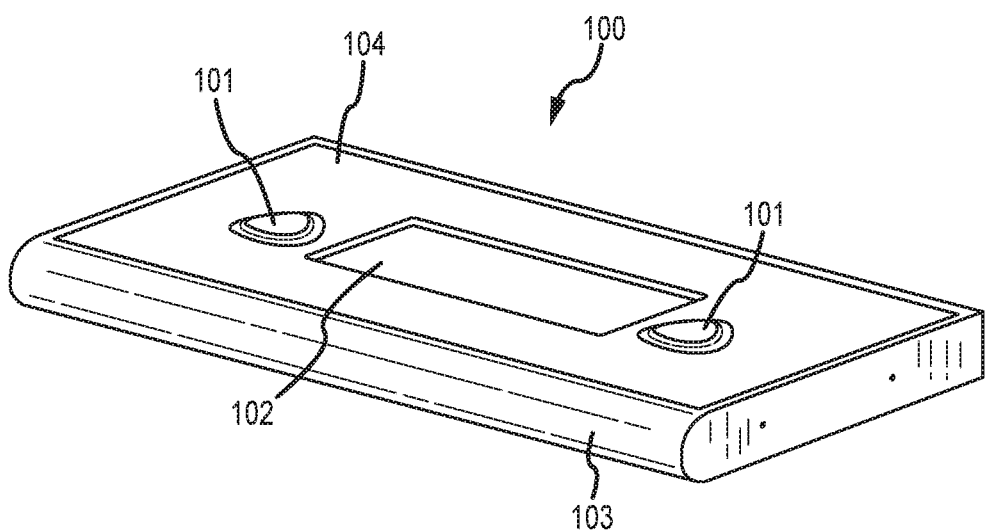
FIG. 1A illustrates an example of a dynamic panel system including push button assemblies and a display area.

FIG. 1A illustrates an example of a dynamic panel interactive display system. The dynamic panel display system 100 includes interactive push buttons 101, which may be depressed by a user to make a selection or input a command to the interactive display system. The push buttons may be various sizes, and may be any shape including round, oval, triangular, reuleaux triangle, square, rectangle, hexagon, or other regular or irregular polygon. The dynamic panel system 100 further includes at least one display area 102, which may be a static or touch screen display area. For example, the display area 102 may provide an LCD image and touchscreen capability. More than one display area 102 may be included in the system. The selectable push buttons 101 may provide controls to all display areas 102 include on the dynamic panel system 100, or each display area 102 may have dedicated push buttons 101 that only control activity on that particular display area. A housing 103 may contain the push buttons 101 and display area 102. The housing includes a top panel 104, having openings therein in which the push button assemblies are positioned.

When a user depresses one of the push buttons 101, a sensor or switch within an assembly including the push button sends a signal to a processing unit or printed circuit board. This signal may be sensed, and may cause a predetermined change in the content of the display areas 102, or may send the signal to a local or remote computer processor or device. Activating a push button may also send other commands to the display panel system 100, or may send commends or signals to remote devices. For example, the dynamic panel system 100 may be included on a gaming machine, and selection of a push button 101 may cause the display 102 on the gaming machine to change. Selection of a push button 101 may also cause a signal to be transmitted to a remote device, such as another gaming machine, a remote computer or smartphone device, or to a remote server dedicated to another service, such as ordering food or drinks. As another example, the dynamic panel system may be used as part of a broadcasting display, and selection of a push button 101 may cause new content to be displayed, selection of a different program, or an indication of a user's choice on an interactive display. The push buttons themselves may also provide a display to the user, and selection of the push button may cause changes to the content displayed on the push button as well.

Figure 1B:
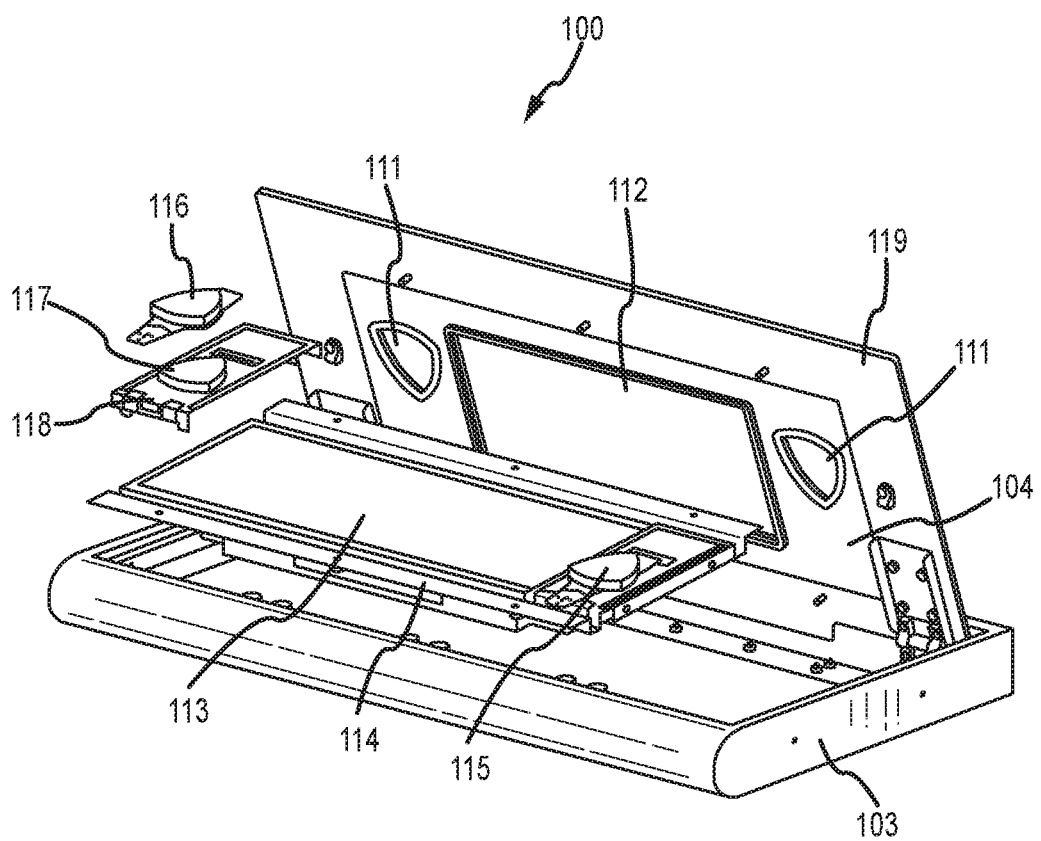
FIG. 1B illustrates the interior components of a dynamic panel system, including modular components.

FIG. 1B provides a view of a dynamic panel system 100, with a top panel 104 of the housing 103 open. The housing 103 may have hinges to allow the top to open, or the top may be connected through removable fasteners or held in place by snap-connections or tabs. As shown in FIG. 1B, the dynamic panel system may be a modular system made of multiple components that are easily accessible, connectable, and replaced. The top of the housing 103 includes openings 111 allowing the push button assemblies 115, 116 to protrude through the top surface and be pressed by a user. The openings may contain bezels that secure the lens of the push button assembly. An area 112 is also provided on the top surface 104 to allow a visible display area on the dynamic panel system. The top panel 104 may be comprised of several layers, including a top layer comprising glass or transparent plastic. The top layer may be clear or transparent over visible display area 112, but then opaque over the rest of the top surface. A touch panel circuit may be positioned beneath the glass panel of the top panel. For example, the touch panel circuit may be a transparent film attached to the underside of the glass of the top panel above area 112 of the visible display. A metal mounting bracket 119 is provided around the periphery of the top panel, having connection points to affix at least some of the interior components. For example, a display housing 114, which may be a bracket or tray, may be affixed to metal studs included on the metal mounting bracket.

A display surface 113, such as an LCD, LED, plasma, or capacitive touch screen, is included. The display surface 113 is positioned on a display housing 114. For example, the display surface may be positioned within a recess of the display housing, fixed to the top of the display housing, held in place by additional components on top of the display surface, or secured to the display housing via a fastener device. The display surface may be positioned below the transparent top panel 104 and touch panel circuit, such that an air gap is formed in the space between the top panel 104 and display surface 113. This air gap may, for example, prevent noise emissions from interfering with inputs on the touch panel circuits when the underlying display surface is an LCD. Portions of the display surface 113 may be visible through the opening 112, allowing a user to view content on the display when the dynamic panel system is in operation. The display surface 113 may further extend underneath the push button assemblies, and an image conduit 117 in the push button assembly may allow the image to be seen by a user through the lens 116 of the push button assembly. The image conduit allows the image below the button lens, to appear to the user at an increased height as compared to the LCD viewable area 112. The image within the push button protrudes above the top panel surface to provide an accentuated image to the player/user. As shown in the figure, the image conduit 117 and lens 116 may be positioned on a tray 118 of the push button assembly, with the tray being configured to fit into the housing of the dynamic panel system 100. The tray 118 may include connection points configured to connect to the display housing 114, thereby securing the push button assembly to the display housing 114. The lens assembly may be connected to the display housing 114, or to the housing 103 of the dynamic panel system, through snap-in connections, grooves, screws, tabs, or other fasteners.

The image conduit 117 may be fixed within tray 118, while lens 116 pivots and moves up and down to actuate a switch or other sensor element mounted on tray 118. The switch or sensor element may have an independent cable connecting to a host machine, including an in-line connector enabling easy disconnection. The switch or sensor may include a mechanical micro-switch, attached to the tray 118, which provides tactile feedback to the user when the lens is depressed and activates the switch. Alternatively, tactile feedback may be provided by a haptic feedback device and method. Haptic feedback devices recreate the sense of touch by applying forces, vibrations, or motions, to the user. These devices can also provide an audible signal, such as a clicking sound. These haptic feedback devices may be located within the push button assembly, or may be located in the tray or another area of the dynamic panel system. Examples of haptic feedback devices that may be included in the dynamic panel system include one or more: electrical solenoids, mechanical micro-switches, vibration motors, rumble packs, and/or electrical relays including a coil, solenoid, and switch.

In FIG. 1B, lens assembly 115 is shown in the secured position. Each push button assembly may include a liquid channel and outlet, directing any liquid which may ingress into the assembly through the channel and outlet and into a designated channel in the display housing or dynamic panel system housing. The liquid channel and outlet may be included on the tray 118, or on a fixture or bottom tray of the lens 116. By including designated channels and openings for any liquid which may ingress into the system, liquid may be purposefully directed away from vulnerable component such as the display screen, printed circuit boards, or other electronic components. For example, if liquid is spilled on the top surface and enters the push button assembly 115, it will flow over the top glass or lens component and onto tray 118, where it is then diverted through channels and openings away from the display surface 113 and into a cavity. This cavity may be within the housing, or external to the housing, and is configured to hold any liquid that has ingressed into the system. For example, a cavity may be provided below the display housing 114, within the overall display panel system housing 103.

To assemble the push button module, the push button bezels 111 may snap into openings in the top panel 104. The image conduit may be fixed to the tray 118, such that the two are supplied as a combined assembly, so that the location of the image is accurately placed at a pre-defined height above the display surface 113. Tray 118 may be placed onto housing 113 by virtue of tabs and slots, and provision may be made so that it is only possible to assemble in one position. Lens 116 is placed over image conduit 117, and the design of the lens and image conduit may be made such that the lens can only fit over the image conduit one way, including a particular orientation and alignment. A sub-assembly comprising 113, 114, 118, 117 and 116 may be located onto top panel 104 and held in place by multiple fastening elements, such as finger nuts that fix to studs mounted on a metal bracket 119 on the underside of the top panel 104. Two cables may be provided to connect the display surface, such as an LCD, and the touch sensitive elements to a host system, via in-line connectors.

The subassemblies contained within the dynamic panel system, as shown in FIG. 1B, may be made of standardized components designed to removably connect together. For example, while the top lens surface and shape of the push buttons may be unique to the desired application, the underlying components within the dynamic surface is unique for various end users, but the sub-assemblies contained are standard part which may be assembled with a multitude of variations. This allows for standardization of products incorporating the dynamic panel displays or components thereof, realizing cost effectiveness, ease of assembly, ease of replaceability within the operational field, ease of maintaining manufacturing and customer quality, and ease of manufacturing complex products with standard components. The dynamic panel system design, including the standardized modular system of components, also provides for serviceability options in the field of operation. System repairs may be easily performed by removing the modular components and either repairing them or replacing a modular component. This provides a cost effective way to service systems in the field. Further, the modular assemblies are designed to be easily removed and provide easy access for cleaning and replacement, with no use of tools or accessories.

Figure 2A:
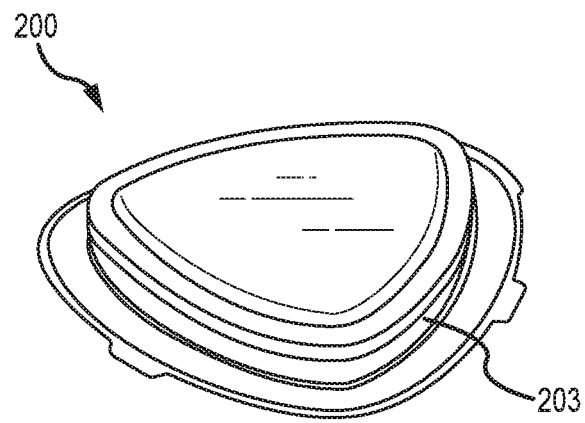
FIG. 2A illustrates a first example of a push button assembly.
Figure 2B:
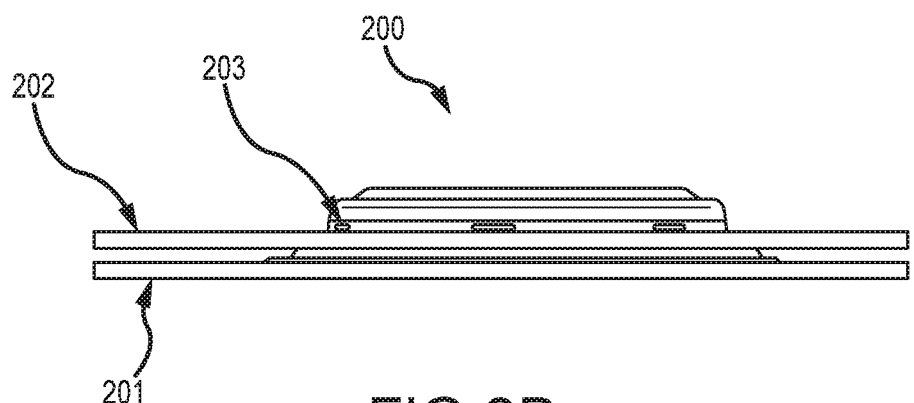
FIG. 2B illustrates the push button assembly of FIG. 2A as used in a system having a display monitor underlying the push button.
Figure 2C:
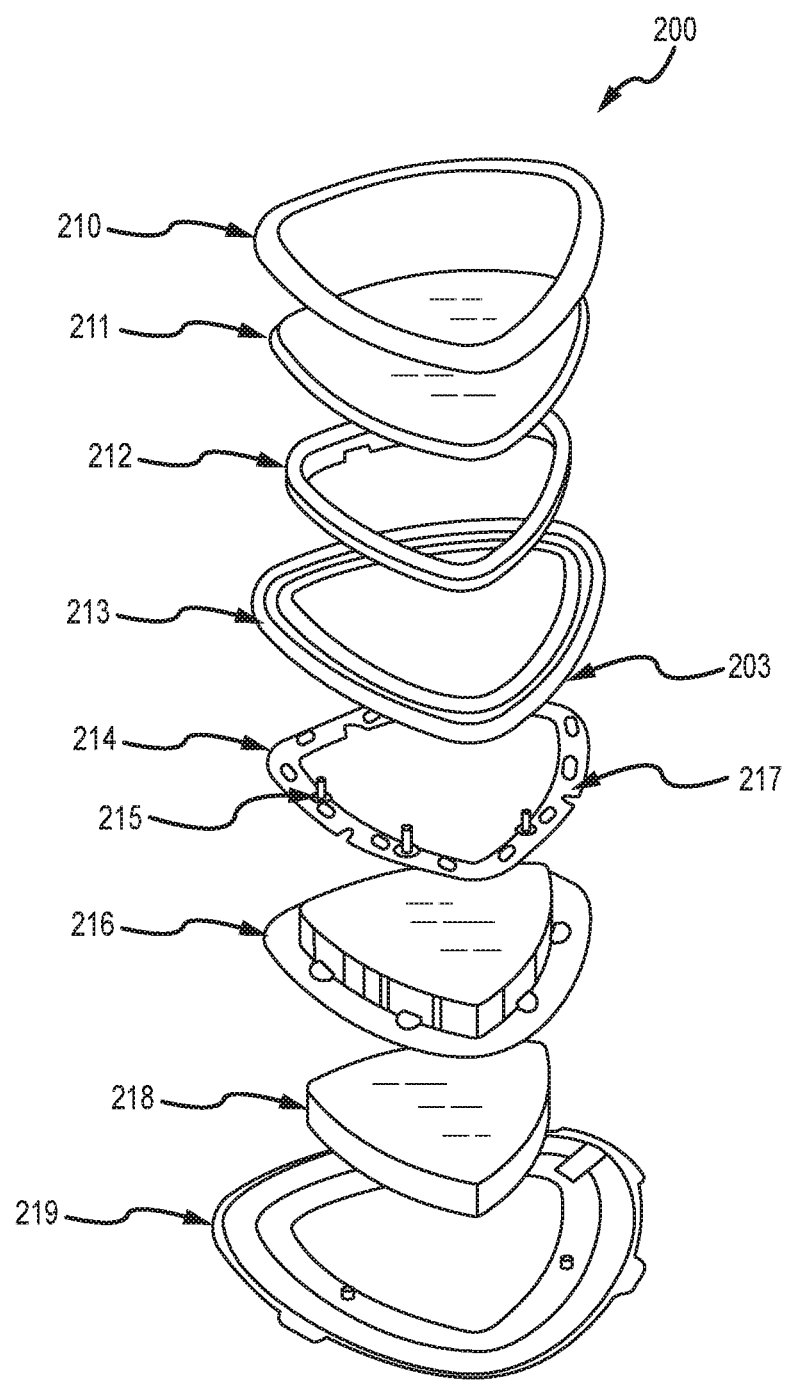
FIG. 2C provides an exploded view of the components of the push button assembly of FIG. 2A.

FIG. 2A is an illustration of an example push button assembly 200 that may be used in the dynamic panel system. As seen in FIG. 2B, the push button assembly 200 may be incorporated into a display system having a display monitor 201 and touch screen element 202. The push button assembly 200 may be placed on top of the touch screen glass 202, which is itself placed above and separated from the display monitor 201. The display monitor may be, for example, and LCD or LED display. The push button assembly may include liquid egress channels 203 formed in a lower bezel element, which are designed to direct any liquid which may flow over or enter into the push button assembly into a tray or channel system, directing it away from the vulnerable display monitor element 201. Thus, if liquid is spilled on the touch screen surface or button assembly surface, the liquid will flow over the touch screen surface or combined lens element and bezel of the push button assembly, and will enter the liquid egress channels below the lens element and be directed away from the underlying display monitor elements. FIG. 2C illustrates an exploded view of the components making up the push button assembly 200. The push button assembly 200 may include an upper bezel 210, a surface lens element 211, and a lens overmold 212 configured to hold the lens in place. The lens overmold 212 may connect into a lower bezel 213 that is secured in an opening in the top panel of the dynamic panel system. The lower bezel 213 contains liquid egress channels 203. The lower bezel 213 is positioned above a printed circuit board assembly (PCBA) 214. A plurality of springs 215 are positioned around the PCBA, and contact the lower bezel 213, allowing the lens and bezel elements to be depressed with respect to the PCBA. The springs may be included in pockets in the lens overmold 212 and an inner lens 216. At least one switch 217, such as a carbon pill switch, gold pill switch, mechanical micro switch, dome switch, optical photo interrupt switch, or other sensing element, is connected to the PCBA 214 above PCBA contact points. When the push button assembly is pressed, the top elements compress the springs and move the switch element downward so that it contacts with the PCBA contact points, creating a signal indicating a user action on the push button assembly. For example, the carbon pill or other switch element may be included within lens overmold 112, such that when the push button assembly is depressed, the lens overmold is moved downward so that the carbon pill or switch elements contacts the contact points on the PCBA. When an optical-interrupt switch is used, depression of the push button assembly by a user may, for example, depress an element into a space between an optical (or IR) emitter and receiver, causing the optical-interrupt switch to detect that it is no longer receiving the emitted optical (or IR) signal. After the user depresses the button, the springs provide a return force to position the lens at an upper rest position. Alternatively, the return force may be implemented by magnetizing the lens assembly components and bezel assembly components with opposite polarities, and the mechanical springs would not be required.

In such a configuration, plastic materials, such as nylon 6, nylon 12, PPS and polymides, used in the lens assembly components and bezel assembly may be injection molded with powder additives such as SRferrite, SmCo, NdFeB or a mixture thereof, to provide molded plastic magnets. These could then be given a particular magnetic polarity, with the lens assembly components being magnetized with one polarity and the bezel assembly magnetized to have an opposite polarity. When incorporated into the push button assembly as described above, the propensity of opposite polarities to repel each other would cause the lens assembly to be forced away from the bezel assembly, such that the lens element naturally resides at the rest position ready for activation by a user. Then, when a user depresses the lens, this magnetic force between polarized plastic magnets would cause the lens to be returned to the rest position after the user releases the button. The use of the polarized plastic magnets would increases life of product due to the elimination of a mechanical return design (for example, springs can bend, break, or become kinked, resulting in decreased performance and the need for replacement and repairs). The polarized plastic magnets also improve the modularity of the push button assembly, due to the elimination of components and flexibility in positioning one component with respect to another. As is known, magnetic force obeys Maxwell's inverse square law—force is inversely proportional to the distance, squared. This property provides the user of the button with an increasing force as the lens assembly is further depressed. Further, the polarized plastic magnets provide an even force depression as the magnet is distributed around the whole material, as opposed to springs which need to be strategically placed.

Similarly, a magnetic solution to returning the lens to the rest position may be implemented using multiple pairs of strategically placed oppositely polarized magnets within the push button assembly. The pairs of opposing magnets provide increasing return force in response to button depression as the lens is depressed, such that when the button is released the magnetic force causes the lens to return to its resting, upper position. The amount of force may be selectively adjusted by the number of magnets used, or by using magnets of differing magnetic field strength. In addition, the magnetic solution for returning the lens to a resting position may be implemented in button assemblies of varying shapes, as the magnet pair can be strategically placed at select locations. For example, a triangular button may have three pairs of opposing magnets strategically placed at the apexes of the triangle or one on each side of the triangle, a square button may have four pairs of opposing magnets, and a round button may have three or more pairs of opposing magnets. The larger the button size, the more force required and the more numbers of paired magnets may be installed. The magnet pairs may be equally distributed, or could be selectively distributed to provide a greater return force at particular areas or locations of the button assembly. By selecting the number and strength of the magnet pairs, the force required for a user to depress and activate the button can also be selectively varied.

As an example, magnets of a first polarization may be located within the lens element, such as in pockets on the underside of the lens. Magnets of opposite polarity may be placed on the underside of the bezel that the lens is connected to. When the button is assembled, the magnets on the lens assembly may be physically opposite the magnets in the bezel, with a space or gap between the lens and bezel allowing the lens element to be depressed when actuated by a user.

In operation, the lens is connected in between upper bezel 210 and lens overmold 212. When the lens is pushed down, all three elements move though the lower bezel 213 fixed to the top panel of the dynamic panel system. As noted above, the lens overmold may house a switch or sensing element that travels downward as the lens is pressed, such that the switch or sensing element is brought closer or farther away from corresponding sensing elements or contacts on the PCBA. The PCBA may be connected to the inner lens in a fixed position. The PCBA may further include, or be connected to, one or more haptic feedback devices such as electrical solenoids, mechanical micro-switches, vibration motors, rumble packs, and/or electrical relays. For example, one or more haptic feedback devices may be included on the PCBA, or may be positioned within one of the over molds, bezels, image conduit, or clamp elements. The haptic feedback devices may also be positioned remote from the button assembly, in another area of the dynamic panel system. When the PCBA receives the signal indicating a user action on the push button assembly, it may activate the haptic feedback device in response.

The PCBA 214 may be positioned around an inner lens 216, such that the PCBA 214 rests on lower ledge areas of the inners lens 216 with the inner lens element protruding above the PCBA and into the bezel and surface lens elements. Inner lens element 216 is a transparent element that helps to seal the PCBA from the surrounding environment. The PCBA may be secured to the inner lens through snap-connections, screws, insertion slots, or any other connection. An optional image conduit 218 may be included, if the push button assembly is desired to be used over a display element, such as shown in FIGS. 1A, 1B above. The image conduit 218 is configured to direct the image from the underlying display element so that it is visible to the user through the surface lens element 211. As shown in FIG. 2C, the switch elements 217 may be strategically placed around the outside of the image conduit 218, such that they do not interfere or block transfer of an image from an underlying display element through the image conduit. Further, the image conduit 218 may be centrally located within the push button assembly, such the entire image from an underlying display element may be transmitted through the image conduit 218 to surface lens element 211. Lastly, the push button assembly may include a lower clamp element 219, configured to secure the push button assembly components in place and easily and removably connect the assembly into a dynamic panel system or other device. The claim element 219 may be positioned within an opening in a top panel, such that its periphery is under the edges of the top panel. The other components may then be fixed to the clamp, such that the push button assembly is held together.

Figure 2D:
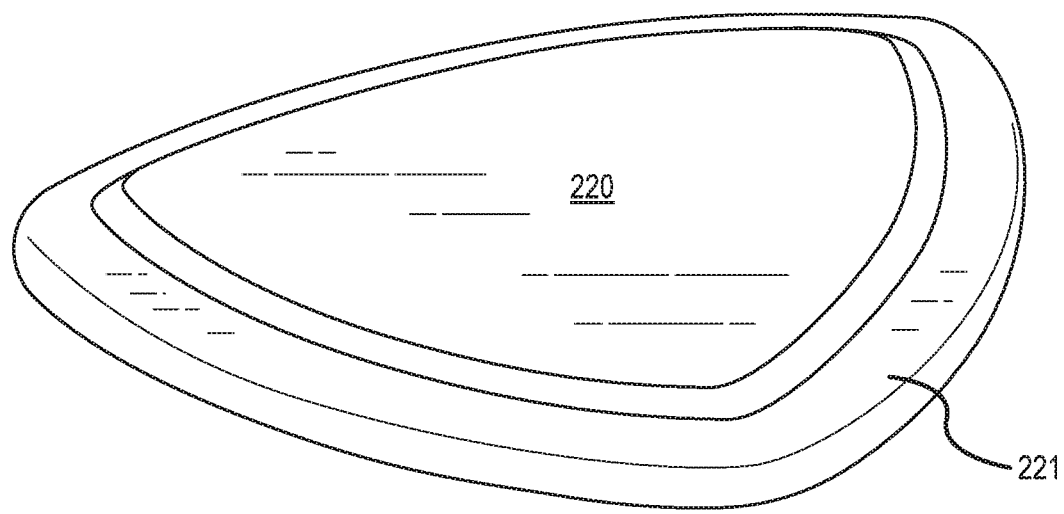
FIG. 2D illustrates an example of a push button assembly with a combined lens and top bezel.

As shown in FIG. 2D, the lens and bezel described above may also be configured to provide maximum liquid ingress protection, by having a combined lens 220 and top bezel 221 without liquid egress channels included on the sides. The combined lens 220 and top bezel 221 may be joined together to form one solid component, such as by over-molding the components together or ultrasonically welding. An inner bezel would be fixed in an opening of the top surface of the dynamic panel system, such as a glass surface. This inner bezel would hold any image conduit included in the push button assembly. A gap or space may exist between the inner bezel and the image conduit, allowing the combined top lens 220 and top bezel 221 to travel up and down. The combined lens and top bezel would move up and down together, in the area between any image conduit and an inner bezel connected to the upper glass panel, allowing activation of a switch or sensing element as described herein. In such a configuration, liquid spilled on the push button assembly with flow over the assembly, and have minimal means to enter the push button assembly. For example, when the push button is depressed, the combined lens 220 and top bezel 221 would act as a wall, and substantially seal the gap or space in the push button assembly, thereby preventing any liquid from entering. When the combined lens 220 and top bezel 221 are in the rest position, liquid may be able to enter into the gap under the inner bezel and image conduit, and enter the interior of the button assembly. After entering the interior of the push button assembly, liquid ingress management including channels, liquid egress areas, trays, and cavities are included to purposely direct the liquid away from vulnerable areas of the system to a safe holding area or to the exterior of the device.

Figure 3A:
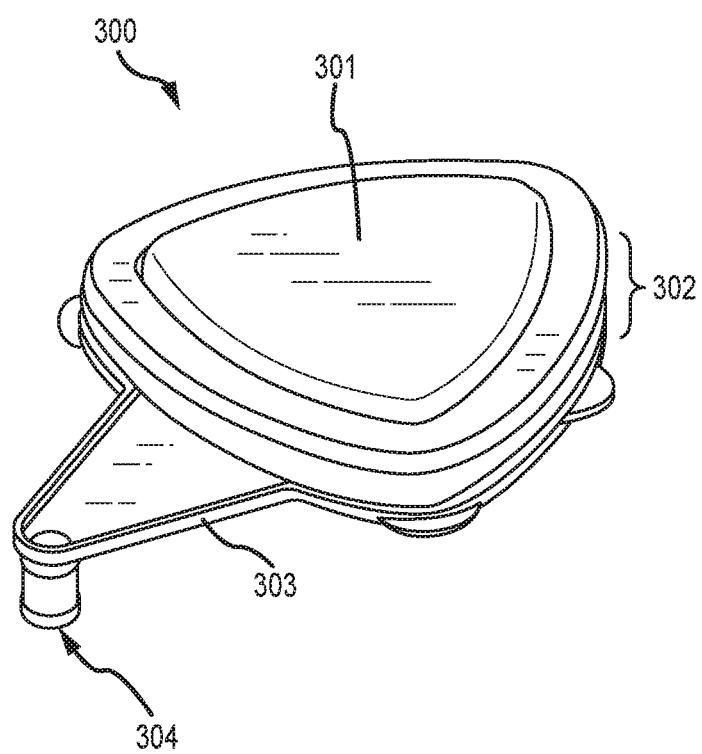
FIG. 3A illustrates an example of a push button assembly mounted on a tray having a water egress, and having a moveable lens element.

FIG. 3A illustrates another example of a push button assembly 300 that may be used in the dynamic panel systems described herein, with a separated lens and bezel elements. In this example, and liquid that spills on the surface of the push button assembly will flow into the assembly, where it will then be directed into particular channels, tray, and liquid egress elements to purposefully direct it away from vulnerable components within the system. As shown in FIG. 3A, the push button assembly may include a surface lens element 301 contained within bezel elements 302. The bezel elements 302 may be secured in a lower clamp element 303, containing a tray and liquid egress 304 configured to channel liquids that may come into contact with the push button assembly.

Figure 3B:
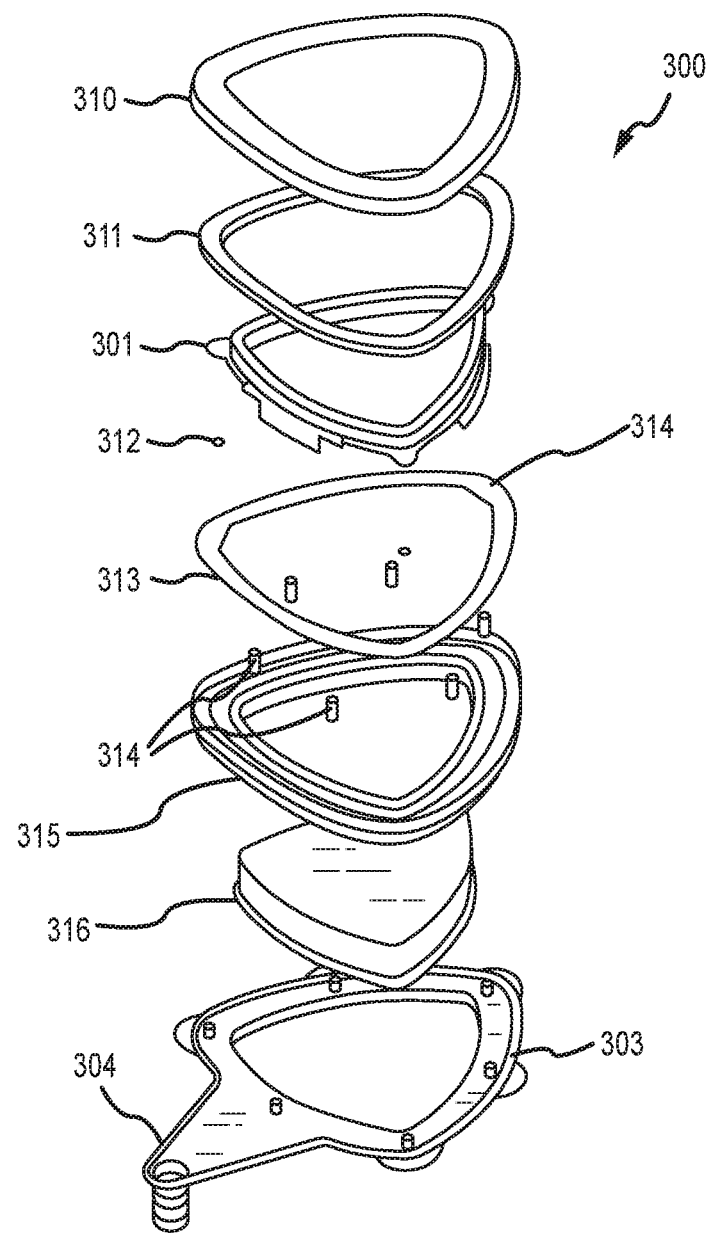
FIG. 3B provides an exploded view of the components of the push button assembly of FIG. 3A.

FIG. 3B illustrates an exploded view of the push button assembly 300. The push button assembly 300 includes an outer bezel 310, an inner bezel 311, and a surface lens element 301. The inner bezel 311 rests on an outer edge of the surface lens element 301. Surface lens element 301 further includes at least one recess configured to hold at least one magnet 312. In operation, a plurality of magnets 312 may be housed within the surface lens element 301. PCBA 313 is positioned below the surface lens element 301. The PCBA 313 may include a sensor or switch 314, such as a Hall Effect switch, positioned to correspond with the positions of the magnets 312, and may be connected to one or more haptic feedback devices as described above. The surface lens element 301, inner bezel 311 and outer bezel 310 connect to a lower bezel 315. The surface lens element is configured to be able to move up and down within the push button assembly. Springs 314 may be included within the push button assembly 300, providing a return force to reposition the push button assembly to a rest position after depression by a user. As image conduit 316, which may be a polymer or glass material, may be placed within the push button subassembly, allowing transfer of an image from a display element underlying the push button assembly 300 to the user through the surface lens element 301. The lower bezel 315 may further connect to a lower clamp element 303, thereby creating a secure push button assembly. The lower clamp element 303 may include a tray portion and a liquid egress 304, designed to channel any liquid that may contact the push button assembly away into particular areas away from vulnerable components.

The push button assembly shown in FIG. 3B may be assembled placing the PCBA 313 into lower bezel 315. Inner bezel 311 may snap onto lower bezel 315, capturing PCBA 313 in a watertight area. Springs 314 may be added to pockets in lower bezel 315, and magnets 312 may be placed into pockets in lens 301. Top bezel 310 snaps into lower bezel 315, holding lens in place. The image conduit 316 image conduit is pressed into lower bezel 315, and may be preassembled with lower bezel 315 before assembly of other components. Clamp 303 may contain pins that locate into designed areas on lower bezel 315, and when put into place holds the push button assembly onto the top panel of a dynamic panel system from underneath. Clamp 303 may have side tabs that allow disassembly when pulled away from the top panel.

In operation, the surface lens element 301 moves within the bezel elements, such that it can be depressed by a user to move up and down. As the lens element 301 is depressed by a user, the magnets 312 housed therein are brought closer to the sensing element 314 on the PCBA 314, thereby generating a signal indicating the push button assembly has been activated by a user. The sensing element, such as the Hall Effect sensor, may further detect the magnitude or extent of depression of the button. The system can sense this extent of depression, and issue different commands or execute different processes based on the amount the user has depressed the push button.

The outer bezel 310 may be mounted to the lower bezel 315, such that its top surface is approximately level with the top surface of the surface lens element 301. An open space may exist between the lens element 301 and the sides of the bezel elements 310, 315. Liquid may enter into this space, where it is then channelled internally within the push button assembly to the lower clamp element 303. The lower clamp element may include a liquid egress 304, which is configured to direct the liquid away from any vulnerable components in the system. For example, the liquid egress 304 may connect to a channel, hose, or cavity to remove or safely hold the liquid.

As described above with respect to push button assembly 200, push button assembly 300 also has the springs and sensing elements strategically positioned such that they do not interfere or block transfer of the image from an underlying display element through the image conduit to the top surface of the push button assembly. Strategic placement of the springs further provides for smooth vertical motion of the push button assembly surface lens element and prevents excess friction from compromising button action. Further, push button assemblies described herein, including the examples shown in FIGS. 2A-2C and 3A-3B, include strategic switch or sensing element positioning provides for the ability to actuate the switch by pressing any point on the surface of the button assembly, without blocking the transfer of any underlying display element image through the image conduit.

Figure 4:
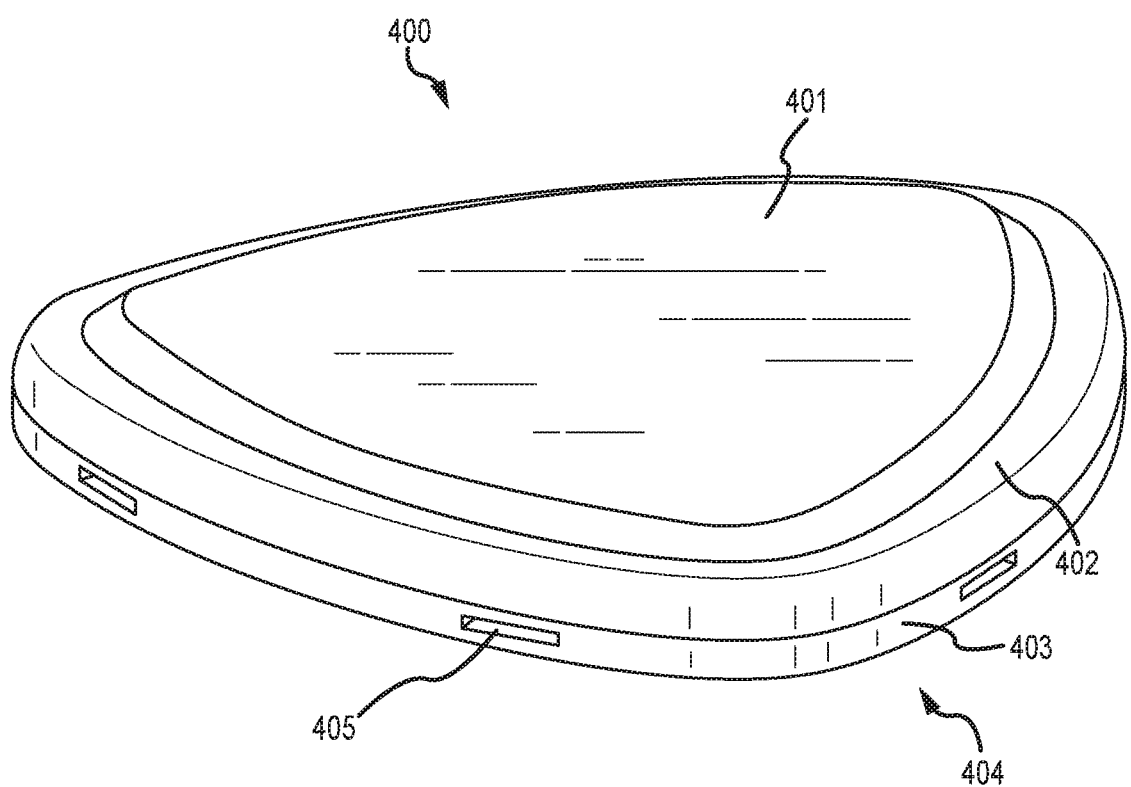
FIG. 4 illustrates a push button assembly mounted to the top of a surface within the dynamic panel system.

As illustrated in FIG. 4, a push button assembly 400 may be mounted to the top of a surface 404 within the dynamic panel system. For example, the push button assembly may be mounted to the top panel of a dynamic panel system, as shown in FIGS. 1A and 1B. The push button assembly 400 may include a lens element 401, outer bezel 402, and bottom bezel 403. This configuration does not allow liquid to enter below the push button assembly into areas below surface 404. Instead, any liquid may enter the assembly 400 in the space between the lens 401 and the outer bezel 402. It is then directed through channels with in the assembly 400, such that it exits the button assembly through exit ports 405 and flows back onto the top of the surface 404.

Figure 5:
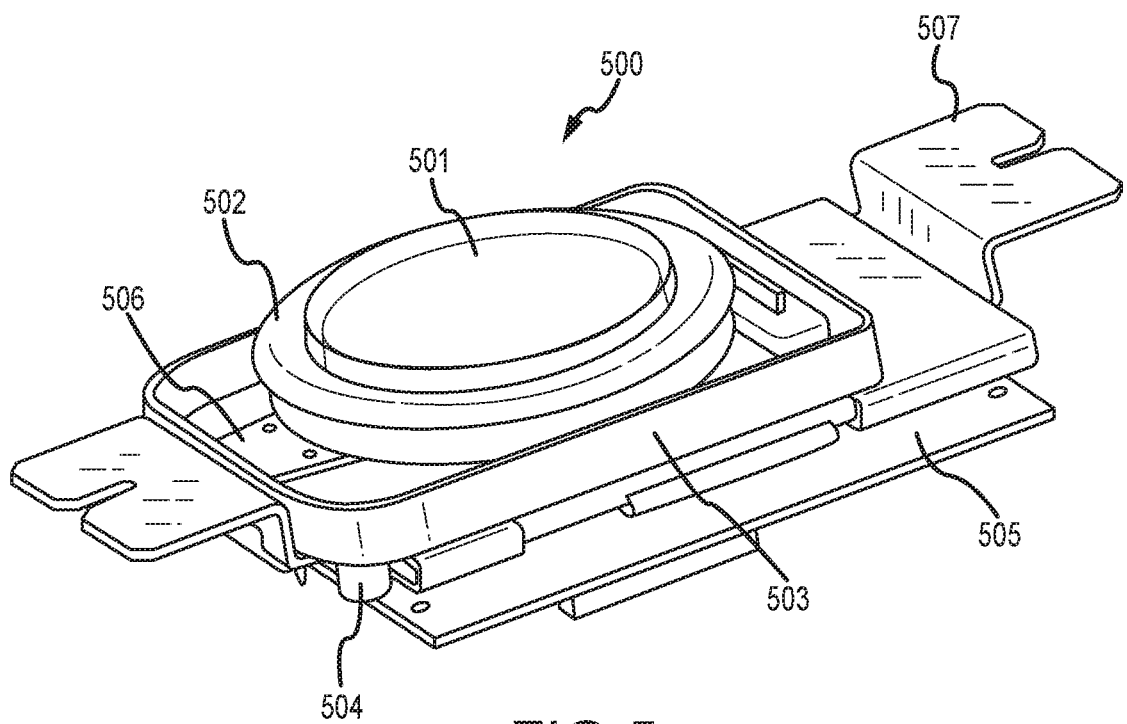
FIG. 5 illustrates an example of a push button assembly mounted on a tray above a display element.

FIG. 5 illustrates an example of push button assembly 500 that includes a lens element and bezel mounted within a tray, and positioned over a display element. The push button assembly may include a lens element 501 contained within a bezel 502. As shown, the push button assembly may have a round shape, although the lens element and bezel can be configured to have any size and shape. Additional components, including a PCBA, switches or sensing elements, and image conduits may be included within the bezel assembly. The push button assembly 500 may be located on a tray 503, above a display element 505 such as an LED or LCD display. The tray may include a liquid egress 504, such as a hole or hose connection. The liquid egress may be located, for example, at a corner of the tray 503. One or more haptic feedback devices may also be located on the tray, or within the bezel assembly. The button assembly may be mounted on a glass element 506, positioned between the bezel 502 and the tray 503. Mounting connections 507 may be provided which allow the assembly to be connected into a device or system. Liquid ingress management is achieved by allowing liquid to enter the push button assembly 500 between the lens 501 and bezel 502. The liquid then flows into the tray 503, where it is collected and exits the tray through egress 504. Thus, the liquid does not reach the underlying display element 505.

Figure 6A:
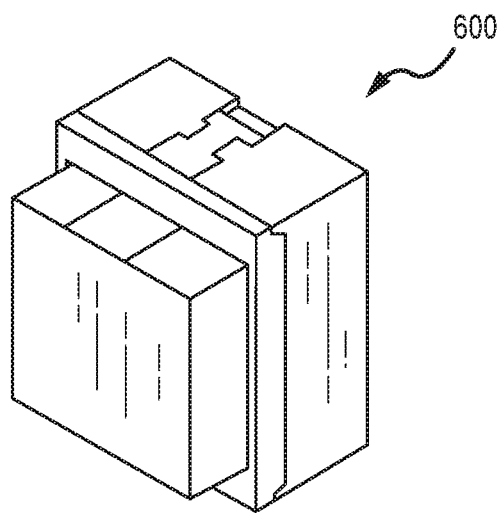
FIG. 6A illustrates a square push button assembly configuration.
Figure 6B:
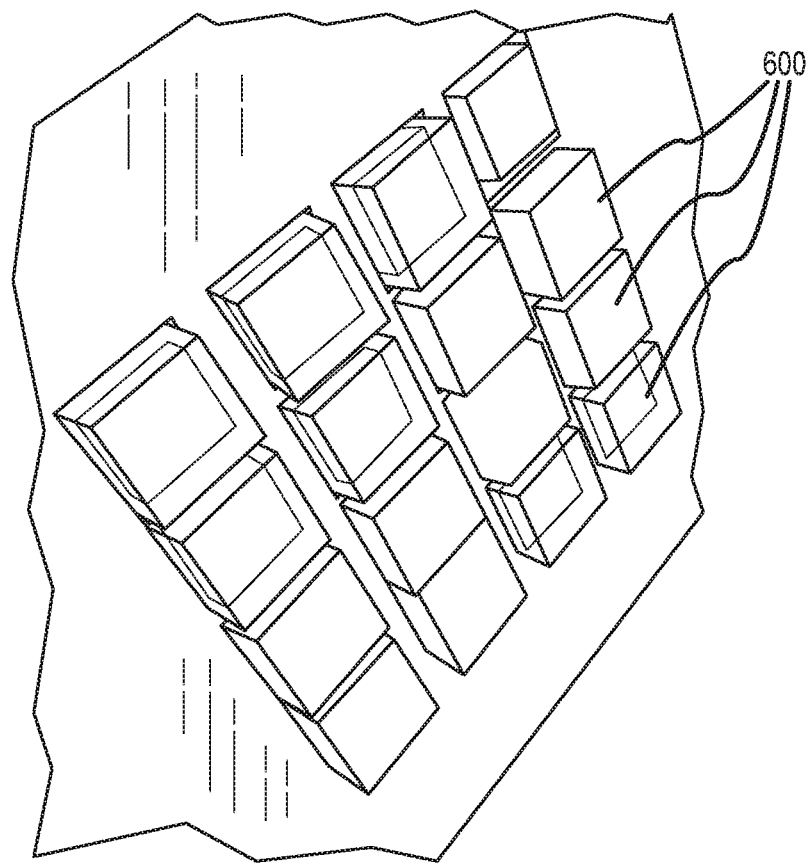
FIG. 6B illustrates a dynamic panel system including a plurality of push button assemblies.

As illustrated in FIG. 6A, the push button assemblies may be configured as square shaped button assemblies 600. Further, multiple push button assemblies 600 may be included within a device or system, as shown in FIG. 6B. For example, in the broadcasting industry, it may be beneficial to include a dynamic panel display having multiple button assemblies for various communication commands or to display varying types of information.

The push button assemblies described herein may have various ways to sense an activation or depression by a user. For example, the push button assemblies may include mechanical micro switches, carbon or gold pill switches, Hall Effect switches, dome switches or optical photo interrupt switches. In addition, haptic feedback devices may be provided to provide tactile and audible responses to the user. As noted above, the push button assemblies may include image conduits to transfer and image from an underling display element, such as an LCD display, to the top surface of the push button. In such configurations, the switches, sensing elements, and haptic feedback devices are located strategically within the push button assemblies, without being obstructed by the image conduit. The image conduit may be located centrally within the push button, with the sensing elements, switches, and other components located around the periphery of the push button assembly, such that they do not occlude the image from being wholly transmitted through the image conduit. Strategic switch location further provides the user with the ability to actuate the push button from any point on the surface of the button, without blocking the transfer of the LCD image via the image conduit. In operation, the push buttons may start in a resting position, from which they can be depressed by a user to issue a command or make a selection. The assemblies may incorporate springs, to provide a return of the button lens to the upper rest position after the user has depressed the button. Strategic placing of springs provides for smooth vertical motion of the button lens and prevents excess friction from compromising the button action.

The push button assemblies may further comprise lighting elements. For example, LEDs may be used to provide lighting within the push button assemblies. In the push button assemblies described herein, the distance between the display element, such as an LCD, and the upper glass surface of a top panel of the dynamic panel system is required to be minimal to reduce the parallax and tunnel effects that may reduce the visual effect of the assembled product. Thus, the LCD top surface should be as close to the glass top panel as possible, thereby limiting the space to include additional components such as LEDs on the underside of the top panel. The dynamic panel systems including push button assemblies described herein may include a printed circuit board having LED devices, and utilizes the space within the glass thickness to house the PCBA including the LEDs. For example, referring back to FIG. 2C, the LEDs may be located on PCBA 214 and enter into channels on the bezel 213. The bezel 213 may be transparent or diffusing, and is connected into the opening of the top glass panel of the DPS. The light from the LEDs may be travel through into bezel, so that the user can see it from above. When the bezel is a diffusive bezel, the occurrence of hot spots may be reduced. The inside of the opening in the top glass panel may be painted or otherwise rendered opaque to prevent the LED from illuminating the top glass panel itself.

Figure 7A:
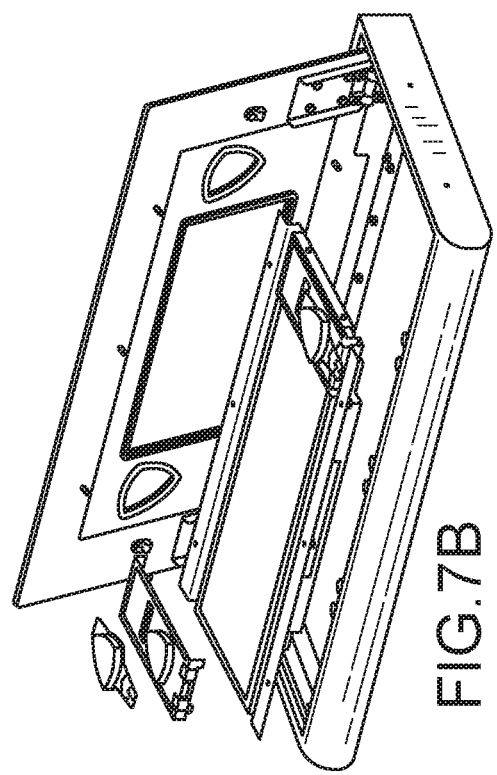
FIGS. 7A-7D illustrates the process or installing or servicing a dynamic panel system.
Figure 7B:
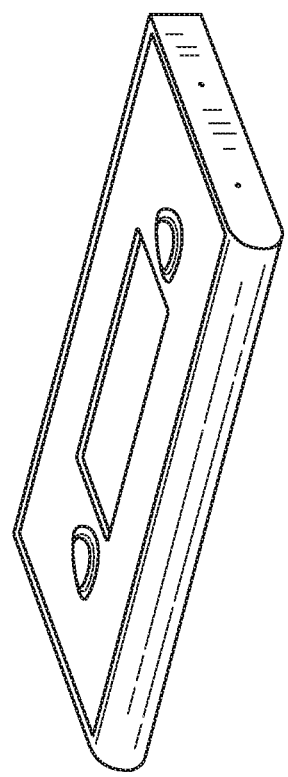
Figure 7C:
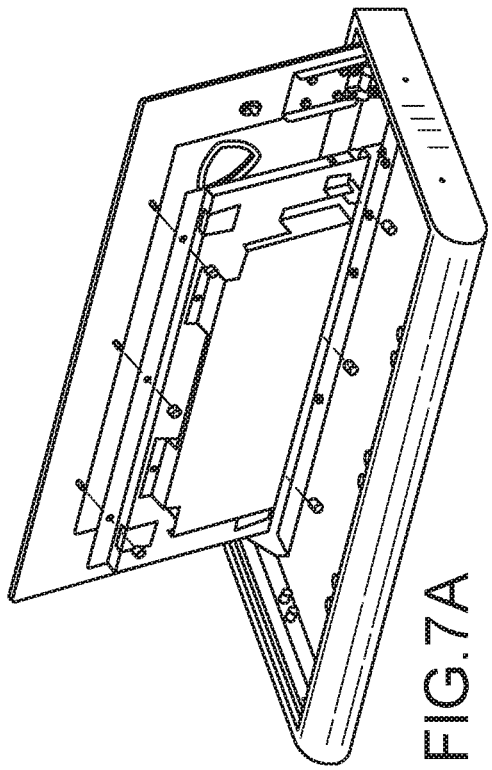
Figure 7D:
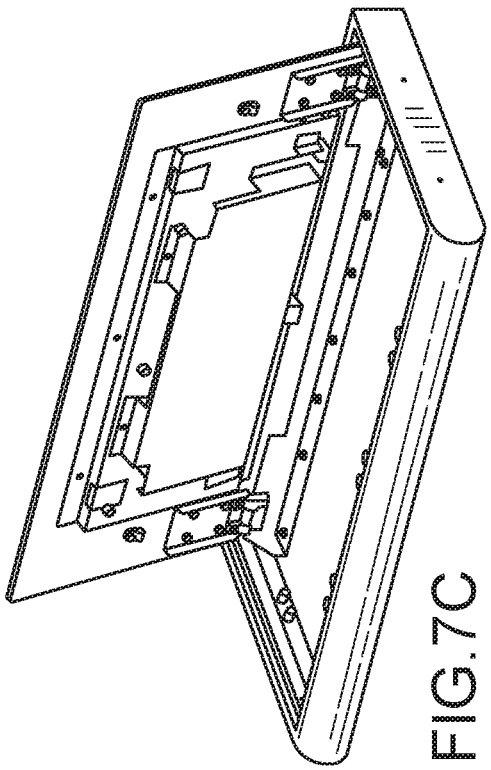

FIGS. 7A-7D illustrates the process or installing or servicing a dynamic panel system. As shown in FIG. 7A, the top of the dynamic panel system may be opened to allow access to the interior components. For example, the top of the system may be connected on hinges, allowing it to flip open, or it may be removable connected with snap-connections, screws, or other removable fastening elements. Once opened, as shown in FIG. 7B, individual module components making up the system may be removed for service, cleaning, repair, or replacement. Then, the modular components may be reconnected as shown in FIG. 7C, and the top surface may then be securely closed to restore the system to its operation state, as shown in FIG. 7D.

The invention claimed is:

1. A modular dynamic panel display system comprising:
 a system housing having a top panel including a transparent display area and at least one opening, wherein the top panel is configured to be opened to provide access to an interior of the system housing;
 a display housing positioned in the interior of the display housing, the display housing including a recess;
 a display surface positioned in the recess of the display housing, wherein the display surface is below the transparent display area of the top panel; and
 at least one removable push button assembly secured to the display housing and configured to protrude from the opening in the top surface, the removable push button assembly positioned above the display surface and comprising:
 a lens;
 at least one sensor element configured to detect activation of the push button assembly by a user; and at least one image conduit configured to transfer content from the display surface to the lens.

2. The dynamic panel display system of claim 1, further comprising at least one liquid egress channel configured to direct liquids to a holding cavity in the dynamic panel display system or direct the liquid to the exterior of the dynamic pane display system.

3. The dynamic panel display system of claim 2, wherein the image conduit and lens are positioned on a tray.

4. The dynamic panel display system of claim 1, further comprising an air gap in the area between the display surface and the top panel.

5. The dynamic panel display system of claim 1, further comprising at least one haptic feedback device.

6. The dynamic panel display system of claim 5, wherein the haptic feedback device includes one or more of an electrical solenoid, mechanical micro-switch, vibration motor, rumble pack, and electrical relay.

7. The dynamic panel display system of claim 1, further comprising a touch sensitive element.

8. The dynamic panel display system of claim 1, further comprising an upper bezel, lens overmold, and lower bezel, wherein the lens is secured between the lens overmold and the lower bezel.

9. The dynamic panel display system of claim 8, wherein the lower bezel includes one or more liquid egress channels.

10. The dynamic panel display system of claim 1, further comprising a return element configured to provide a return force to return the lens to a rest position after it has been depressed.

11. The dynamic panel display system of claim 10, wherein the return element comprising one or more springs positioned around a printed circuit board, allowing the lens, upper bezel, and lower bezel to be depressed with respect to the printed circuit board.

12. A method of assembling a push button assembly in a display system, comprising:
  assembling a push button assembly, the assembly comprising:
    providing an upper bezel and a lower bezel;
    providing a surface lens element;
    providing a lens overmold;
    positioning the surface lens element within the lens overmold and connecting the lens between the upper bezel and lens overmold;
    connecting the lens overmold into the lower bezel;
    positioning the lower bezel above a printed circuit board assembly, the printed circuit board assembly comprising one or more pockets containing one or more return elements;
    providing a clamp element beneath the lower bezel;
  inserting the push button assembly into an opening on a display system housing, wherein the clamp element secures the push button assembly into the opening.

* * * * *